United States Patent [19]
Katz

[11] 3,946,322
[45] Mar. 23, 1976

[54] PULSE DUTY CYCLE TRANSITION MODERATING DEVICE

[75] Inventor: Joel Katz, Los Angeles, Calif.

[73] Assignee: The United States of America as represented by the Secretary of the Navy, Washington, D.C.

[22] Filed: June 17, 1974

[21] Appl. No.: 479,738

[52] U.S. Cl. ............ 328/58; 307/234; 307/265; 307/271; 328/111; 328/140; 332/9 R
[51] Int. Cl.² .. H03K 5/04; H03K 5/20; H03K 1/16; H03K 7/00
[58] Field of Search ............ 328/58, 109, 110, 111, 328/112, 140; 307/234, 265, 271; 332/9

[56] References Cited
UNITED STATES PATENTS

| | | | |
|---|---|---|---|
| 3,204,124 | 8/1965 | Durio, Jr. | 307/265 |
| 3,299,295 | 1/1967 | Goda | 307/271 |
| 3,304,437 | 2/1967 | Dano | 307/265 |
| 3,350,637 | 10/1967 | Pochtar | 328/140 |
| 3,454,884 | 7/1969 | Ziehm | 307/265 |
| 3,579,146 | 5/1971 | Paine | 307/265 |
| 3,694,758 | 9/1972 | Dyer | 328/140 |

*Primary Examiner*—Stanley D. Miller, Jr.
*Attorney, Agent, or Firm*—R. S. Sciascia; Charles D. B. Curry

[57] ABSTRACT

A pulse width control circuit that narrows, then allows a gradual increase in the pulse width of the output pulses to the width of the input pulses that is activated as the pulse repetition rate of the input pulses increases. The pulse width control circuit will provide the turn-on transient and high voltage supply transient suppression for a pulsed transmitter by selectively interconnecting a pulse repetition detector and a variable pulse width generator with a combining logic circuit.

6 Claims, 8 Drawing Figures

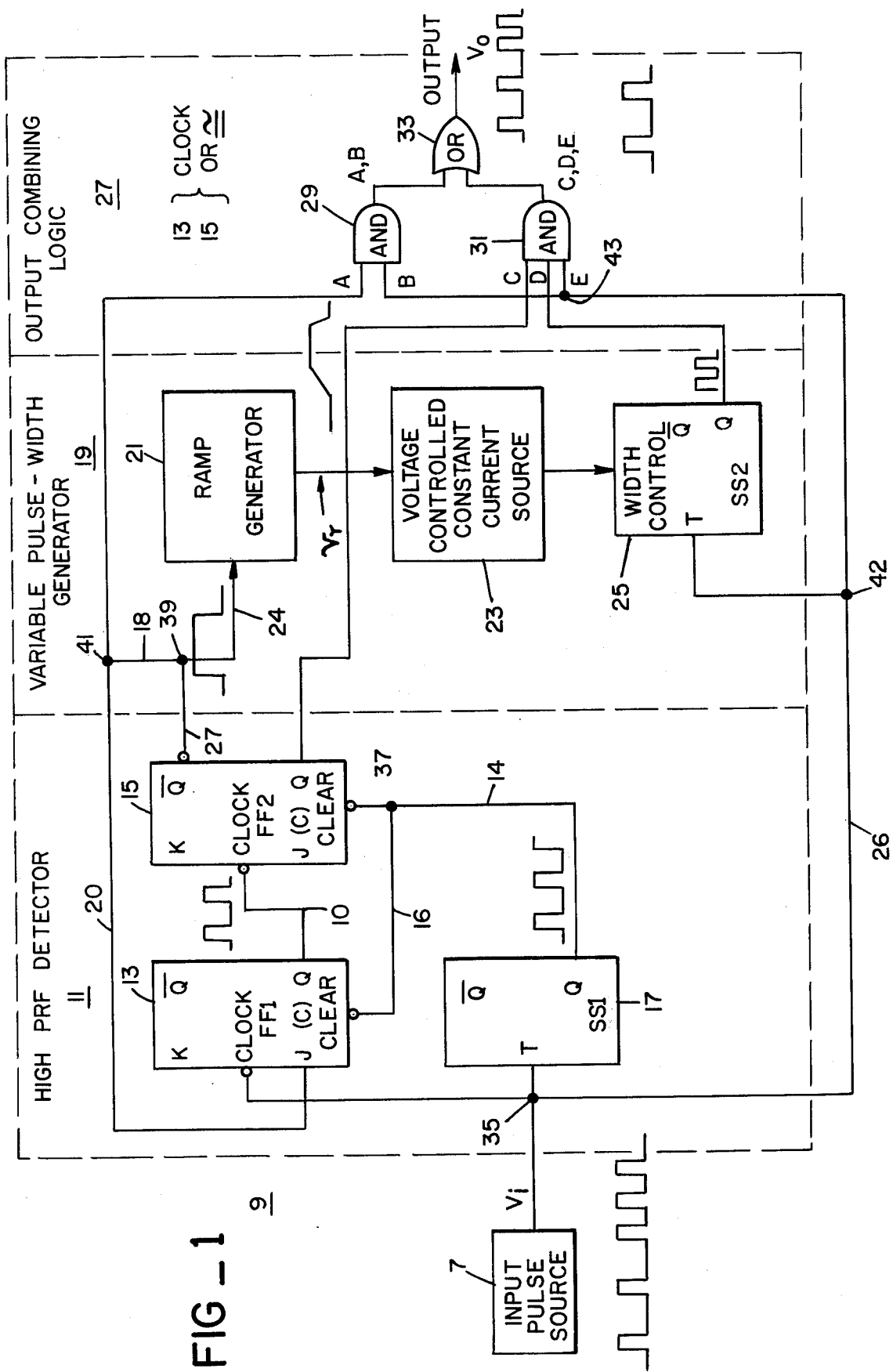

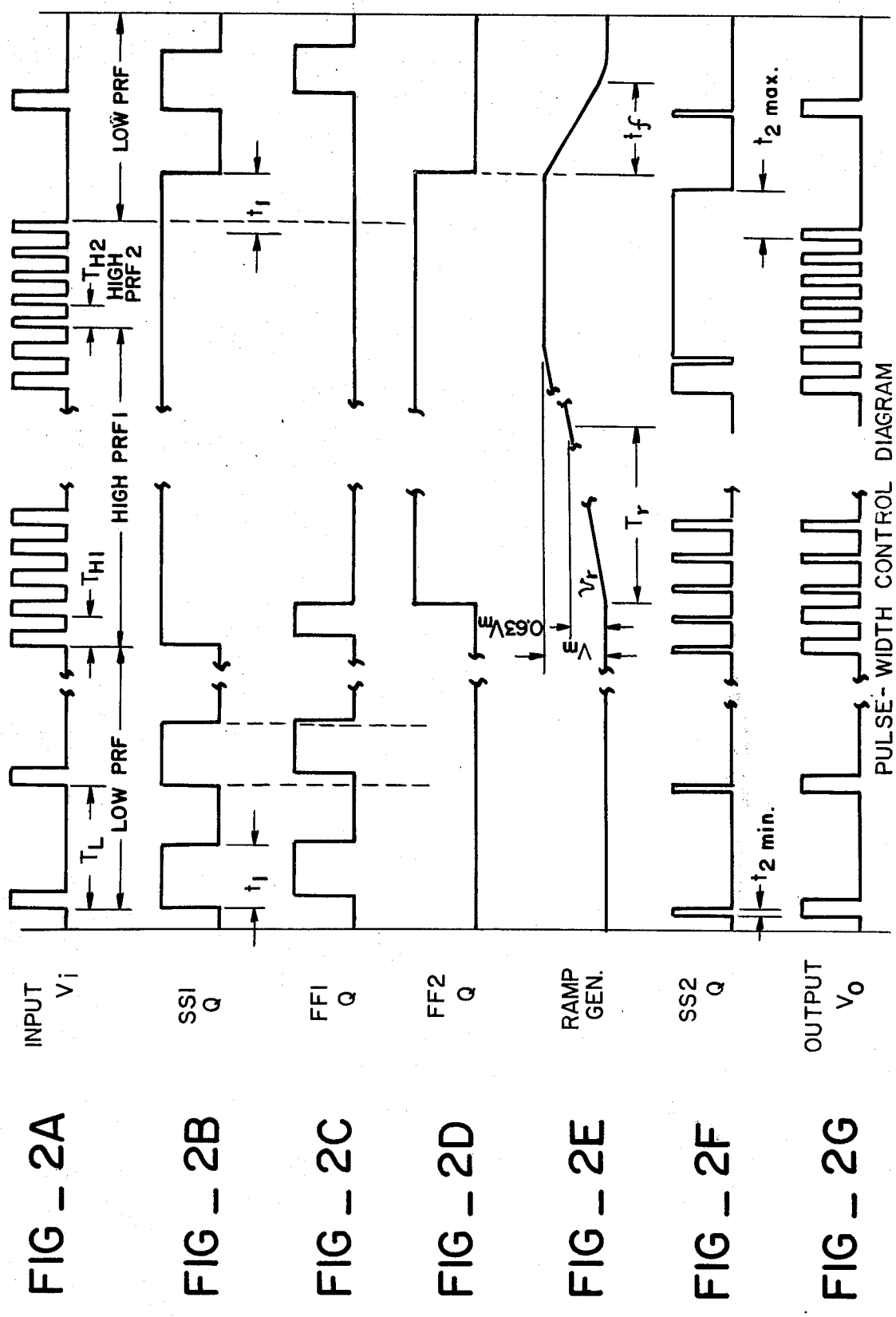

PULSE DUTY CYCLE TRANSITION MODERATING DEVICE

BACKGROUND OF THE INVENTION

1. Field of the Invention

The subject matter of the present invention relates to a pulse width control circuit. More particularly to a pulse width control arrangement which provides turn-on transient and high voltage supply transient suppression for pulsed transmitters.

2. Description of the Prior Art

The prior pulse forming transmitters such as pulsed - TWT radar transmitters used high voltage capacitors which are both physically and electrically larger than is considered feasible to those skilled in the art. Moreover, by reducing the leakage inductance in the high voltage pulse forming transmitter arrangement below the current design levels there would also be an accompanying reduction in the turn-on transient and high voltage transient suppression for the high power transmitter.

SUMMARY OF THE INVENTION

Briefly the present invention is a width control circuit that first narrows, then allows a gradual increase in the pulse width of the output pulses to the width of the input pulses that is activated by an increase in the pulse repetition rate of the input pulses. The pulse width control circuit will provide the turn-on transient and high voltage supply transient suppression for a pulsed transmitter by selectively interconnecting a pulse repetition detector and a variable pulse width generator with a combining logic circuit. The pulse width control circuit performs a type of filtering action at turn-on and at the high duty cycle by synthesizing an artificially smoothed network response function as the driving function for a high voltage filter network.

Statement of the Objects of the Invention

A primary object of the present invention is to provide a novel circuit arrangement which controls the turn-on transient and high voltage supply transient for pulse transmitters.

Another object of the present invention is to provide a novel pulse width control arrangement which narrows, then allows a gradual increase in the pulse width of the output pulses from the pulse width control to the width of the input pulses to the pulse width control when the pulse repetition rate of the input pulses increases.

Other objects, advantages and novel features of the present invention will become apparent from the following detailed description of the invention when considered in conjunction with the accompanying drawings wherein:

BRIEF DESCRIPTION OF THE DRAWINGS

FIG. 1 is a block diagram representation of the pulse width control circuit and;

FIG. 2 illustrates waveforms A – G observed at the various circuit elements of the pulse width control circuit of FIG. 1.

DESCRIPTION OF THE PREFERRED EMBODIMENT

As shown in FIG. 1, the pulse width control circuit 9 of the present invention is generally comprised of three main functional groups: the high pulse repetition frequency detector, hereinafter referred to as high PRF detector 11, variable pulse-width generator 19 and the output combining logic 27. The pulse width control circuit 9 functions to transform an abrupt increase in both the duty cycle and the pulse recurrence frequency (PRF) of a pulse train, at the input of circuit 9, to a gradual increase in the duty cycle at the output of circuit 9 so that the final value at the output is equal to the initial value at the input.

Referring specifically to FIG. 1, the high PRF detector 11 includes flip-flop circuit 13, flip-flop circuit 15 and single shot multivibrator 17. Flip-flops 13 and 15 are both preferably of the conventional J–K type; however, any equivalent circuits may be used. Flip-flops 13 and 15 are specifically connected to each other and form a divide-by-two-counter. The input pulse train $V_i$ from input source 7 is applied as a clock input pulse to flip-flop 13 via junction 35. The Q output of flip-flop 13 is applied as a clock input pulse via lead 10 to flip-flop 15 where the Q output is the principal terminal and $\overline{Q}$ is the complimentary terminal. The input pulse train $V_i$ from input source is applied to input T of multivibrator 17. Multivibrator 17 is a conventional one shot multivibrator circuit. The J and K inputs provide separate clock set and reset inputs and allow the flip-flops 13 and 15 to change state, if desired, on successive pulses. Generally, J–K flip-flop circuit has set and reset capability, however, for purposes of the present invention only the reset capability is required. Moreover, in flip-flop 13 the K input and complimentary or $\overline{Q}$ output functions are not required in the present invention. Additionally the J–K input functions are not required in flip-flop 15. The Q output of multivibrator 17 is operatively connected to flip-flops 13 and 15 via leads 14 and 16 through junction 37 to provide a reset (clear) function to both flip-flops 13 and 15. The clear or reset functions of the flip-flops of the illustrated embodiment are activated by the low state of the Q output of multivibrator 17. The $\overline{Q}$ output of flip-flop circuit 15 is coupled to the J input of flip-flop circuit 13 by conductors 18 and 20 via junctions 39 and 41 respectively.

Referring to FIGS. 1 and 2 in the low PRF mode, the leading edge of an input pulse $V_i$ (such as indicated graphically by waveform A of FIG. 2) entering the T input of multivibrator 17 yields a pulse width $t_1$ at the Q output of multivibrator 17 as indicated graphically by waveform B. Note, the complimentary or $\overline{Q}$ output function is not required in multivibrator 17 for purpose of operation of the present invention.

The time between input pulses $T_L$ is larger than $t_1$ for the low PRF case as indicated graphically by waveforms A and B of FIG. 2. Therefore the Q output of multivibrator 17 returns to its rest state between input pulses $V_i$ from pulse source 7. Each time multivibrator 17 is triggered, multivibrator 17 enables flip-flop circuits 13 and 15 for a period $t_1$ as graphically illustrated by wave forms B – D of FIG. 2. Input pulse $V_i$ train is applied as a clock input to flip-flop circuit 13 which causes output Q to change state at each negative-going edge of the clock pulse as illustrated by waveform C of FIG. 2 (low PRF only). The output Q of flip-flop circuit 13 is applied as the clock-pulse input to flip-flop 15. The output Q of flip-flop circuit 15 will go to the high logic state at the negative-going edge of its clock pulse as illustrated by waveform D. This would be the second negative-going edge of the input pulse $V_i$ train occurring while the Q output of the multivibrator 17 remains at its high state. Multivibrator 17 resets before the next low PRF input pulse $V_i$ arrives. Multivibrator 17 clears or resets both flip-flop circuits 13 and 15 before the Q output of flip-flop circuit 15 can count to two. Thus the Q output of flip-flop circuit 15 remains low for low PRF or no-pulse inputs, while the $\overline{Q}$ output of flip-flop circuit 15 remains at a high state.

Referring again to FIGS. 1 and 2, in the high PRF mode, the same period, $t_1$, will generally be larger than that of the lowest of the high PRF's. One practical application of the present invention, utilized in an airborne radar system having a low p.r.f. mode of up to 20 kHz and a high p.r.f. mode of 200 kHz and above uses a value of $t_1$ of 6 microseconds. Such a value of $t_1$ in the actual application, only representative of the specific application and by no means limiting, provides the necessary sensivity for quick speed of decision and a tolerance appropriate for the implementing devices. Operating in the high PRF mode causes the Q output of multivibrator 17 to remain at its high state between input triggers illustrated by waveform B of FIG. 2 for high PRF. Flip-flop circuits 13 and 15 become enabled (a high state) by the Q output of multivibrator 17. Flip-flop circuits 13 and 15 stay enabled during the entire high PRF mode. The negative logic flip-flops thus drive the Q output to the high state and the $\overline{Q}$ output to the low state during the duration of the high state of the Q output of multivibrator 17. Hence, flip-flop circuit 13 will trigger at each negative-going edge of the input pulse $V_i$ while flip-flop circuit 15 triggers at every other negative-going edge of the input pulse $V_i$ as illustrated by waveforms A, C, and D of FIG. 2. The $\overline{Q}$ output of flip-flop circuit 15 is fed back to the reset or J-input of flip-flop circuit 13 through leads 18 and 20 via junctions 39 and 41. At the first negative going edge of $V_i$ after high PRF, the enabled flip-flop 13 causes Q to go to its high state. The second negative going edge causes Q to go low. The low input at the clock of flip-flop 15, now enabled, drives the Q of flip-flop 15 high and the $\overline{Q}$ low. Once $\overline{Q}$ reaches the low state with the clear input of flip-flop enabled, a steady state of the Q and $\overline{Q}$ outputs is caused by the fact that, via feedback of $\overline{Q}$ of flip-flop 15 to the reset or J input of flip-flop 13, flip-flop 15 will see no more input pulses after the first two $V_i$ in high PRF. This forces the Q output of flip-flop circuit 13 to remain in a low state after one pulse and the Q output of flip-flop circuit 15 to remain in a high state during the input high PRF mode. The $\overline{Q}$ output of flip-flop circuit 15 drives to its low state and remains there during high PRF. Any further increase in the duty cycle or any increase in PRF as indicated by high PRF2 in FIG. 2, after high PRF has been initially sensed, will cause no further change in the logic state at the various outputs of multivibrator 17 and flip-flop circuits 13 and 15. The termination of the high PRF mode is sensed by multivibrator 17 whose Q output goes into the low state after a $t_1$ delay from the leading edge of the last high PRF input pulse $V_i$ as shown by waveforms A and B taken together. A discussion of the variable pulse width generator 19 and its interconnective function with the high PRF detector 11 follows.

As shown in FIG. 1 the variable pulse width generator 19 is comprised of conventional ramp generator 21 and voltage controlled constant current source 23 and width controlled single shot multivibrator 25. The $\overline{Q}$ output from flip-flop circuit 15 is connected through leads 27 and 24 to the input of ramp generator 21 via junction 39. Ramp generator 21 is enabled when the $\overline{Q}$ output of flip-flop circuit 15 goes into its low state or high PRF sensing as illustrated by waveforms A and E of FIG. 2. The proper duration of the ramp signal is determined by the RC time constant $T_r$ which is at least five times the leakage inductance ringing period of the transmitter high voltage power supply filter network. Referring specifically to waveform E of FIG. 2 the ramp voltage $v_R$ increases according to the equation $Vm(1 - e^{-t}T_r)$ where $Vm$ is the maximum ramp voltage and $t$ is the rise time. Hence, the ramp voltage $v_R$ remains at $Vm$ until a change to low PRF is sensed or the $\overline{Q}$ output of flip-flop circuit 15 goes into its high state. The ramp signal is quickly reset to its base-level with a fall time $t_f$ when the low PRF is sensed. The fall time is made short, i.e. $t_f \lesssim Tr/4$ to allow the ramp generator 21 to fully reset to the base-level during brief periods when the input pulse train $V_i$ may be blocked off. Preferably the exponential function is used rather than a linear function because of the choice made in mechanizing the width-control function to favor simplicity. The output from ramp generator 21 is applied to the input of voltage controlled constant current source 23. Constant current source 23 directs a current into the width control input of width control circuit 25 which width modulates its output pulses. Referring to FIGS. 1 and 2 and particularly to waveforms E and F of FIG. 2 the maximum current is directed into width control circuit 25 during the low PRF cycle when the ramp voltage $v_R$ is at its base level. This corresponds to the minimum pulse width out of pulse width control circuit 25, to $t_2$ minimum of waveform F of FIG. 2 for each input trigger pulse. The width control current will diminish during the ramp period, or the start of high PRF, to a minimum steady-state value which sets the maximum pulse width out of width control 25 or at $t_2$ max illustrated by waveform F. Preferably a practical limit on the ratio of maximum to minimum current is about 10/1. The T input of width control circuit 25 is connected to the T input multivibrator circuit 17 by lead 26 via junctions 42 and 35. This allows pulse source 7 to provide a reference pulse train $V_i$ to both multivibrator 17 and width control circuit 25. Width control circuit 25 may be a single shot microcircuit such as a Fairchild 9602 or its equivalent. The complimentary or $\overline{Q}$ output is not required. The timing capacitor (not shown) for width control circuit 25 is selected to provide a sufficiently low duty cycle at the output of width control circuit 25 at the start of high PRF to avoid a supply transient. This timing capacitor should also simultaneously satisfy the requirement that the maximum pulse width out of control circuit 25 be greater than the largest interpulse period $T_{H1}$, as shown by waveforms A and F in the high PRF mode. This insures that the Q output of width control circuit 25 will become a high state $d\,c$ level at the end of the width modulation ramp period. Each low PRF input-trigger pulse $V_i$ yields a minimum-width pulse at the output of width control circuit 25 but does not appear at the output due to the properties of the output combining logic circuitry 27 which will be described below.

In describing combining logic 27 of FIG. 1 apparatus of the present invention the logic diagrams representing individual "AND" and "OR" gates are functional and do not indicate the actual circuitry involved. For example, diode transistors or equivalent switching combinations could be used as long as the proper function was performed. Since combining logic circuits are well known in the art the actual circuit diagram or schematic is not needed in understanding the circuit logic.

In FIG. 1 the output combining logic 27 is an arrangement of two AND gates 29 and 31 followed by an OR gate 33. The J input of flip-flop circuit 13 is connected to the A input of AND gate 29 via conductor 20 The B input of AND gate 29 is coupled to the clock input of flip-flop circuit 13 through conductor 26 via junction 35 and to the T input of width control circuit 25 via junction 42. AND gate 29 is connected to the E input of AND gate 31 via junction 43. AND gate 31 is connected to the Q output of flip-flop circuit 15 and to the Q output of width control circuit 25 and to input pulse source 7. OR gate 33 is connected to the outputs of AND gates 29 and 31 respectively.

Referring to FIGS. 1 and 2 gate 29 is a low-PRF steering gate which permits the input pulses to pass through gate 33 and the main output $V_o$ only when low PRF is sensed or the $\overline{Q}$ output of flip-flop circuit 15 is at its high state. A reversed situation takes place at the high-PRF steering gate or gate 31. Here the input pulses ANDed with the width-modulated pulses out of width control circuit 25 are allowed to pass through to gate 33 only when high PRF is sensed or Q of flip-flop circuit 15 is at its high state. ANDing of the input pulses $V_i$ with those out of width control circuit 25 yields, out of AND gate 31, a pulse train that has the width modulation of circuit 25 until such time that the pulse widths out of circuit 25 become greater than those at the input. Thus, any pulse jitter which may exist out of circuit 25 does not appear at the main output $V_o$ after the input pulse $V_i$ width has been exceeded by those out of circuit 25. This ANDing process also acts as a pulse-width clamp circuit to guarantee that the output pulses $V_o$ can only increase in width to a maximum set by the input pulse width. The pulse-width control 9 provides turn-on transient and high voltage supply transient suppression for high duty-cycle, pulsed-Traveling Wave Tube (TWT) radar transmitters. The pulse-width control receives the modulator trigger pulses at its input. It sends out pulses to the modulator which are initially narrow (low duty cycle), but gradually increase to equal the input pulse width whenever the pulse-width control senses a low (or off)-to-high PRF transition. The pulse-width control 9 senses this transition in less than two interpulse periods after the start of the high PRF mode. This time is much shorter than the power supply or line voltage transient build-up time, so no transients occur during the sensing period. Transients are suppressed after the sensing period by virtue of the slow transition in duty cycle (slow change in power line and supply loading) created by the pulse-width control. The duration of the width modulation interval is made long enough to guarantee an overdamped transient response from the filter network of the high PRF turn on. The pulse-width control may be incorporated into transmitter logic circuitry to eliminate a low-duty cycle/high-duty cycle undershoot on the TWT collector supply voltage.

What is claimed is:

1. A duty cycle transition moderating system which comprises:
   a. an apparatus input channel to receive an input pulse train having a high pulse repetition frequency region and a low pulse repetition frequency region, the transition from low to high pulse repetition frequency occurring when the pulse period becomes equal to or less than $t_1$ when the pulse train is applied to the system said detector including means for producing a pulse of width $t_1$ in response to the leading edge of the pulse of said input pulse train;
   b. a high repetition frequency detector in electrical connection with said apparatus input channel to sense a change of frequency of the pulses of said input pulse train from the region of low pulse repetition frequency to that of high pulse repetition frequency;
   c. a variable pulse width generator in electrical connection with said apparatus input channel and with said high pulse repetition frequency detector to produce a pulse train of pulses of narrowed, then gradually increasing width synchronous with that of the input pulse train; and
   d. output combining logic in electrical connection with said apparatus input channel and said high pulse repetition frequency detector and said variable pulse width generator to combine outputs thereof to produce a gradual increase of duty cycle when the input train of pulses makes a transition from the region of low pulse repetition frequency to high pulse repetition frequency.

2. A high pulse repetition frequency detector as described in claim 1 which comprises:
   a. a one shot logic device having an input terminal and an output terminal said one shot logic device electrically coupled at its input terminal to said apparatus input channel and producing a pulse of width $t_1$ in response to the leading edge of a pulse at its input;
   b. a first flip-flop logic device having an output terminal, a clock input in electrical connection with said apparatus input channel, a clock reset input and a clear input said clear input in electrical connection with said one shot device output;
   c. a second flip-flop logic device having a first output and a second output of complementary logic, a clock input and a clear input;
   d. said clock input of said second flip-flop in electrical connection with the output terminal of said first flip-flop, said clear input of said second flip-flop in electrical connection with the output terminal of said one shot logic device, said first output of said second flip-flop in electrical connection with said output combining logic, said second output of said second flip-flop in electrical connection with said clock reset of said flip-flop and with said variable pulse width generator and with said output combining logic so that when the period of said input pulse train is $t_1$ or less said first output of said second flip-flop is maintained, during the duration of the portion of the pulse of such period, in its high logic state and said second output of said second flip-flop is driven to and maintained in its low logic state.

3. A variable pulse width generator as described in claim 2 which comprises:
   a. a ramp generator having an input terminal and a voltage output terminal, said input terminal in electrical connection with said second output of said second flip-flop, said ramp generator enabled when the low logic state is sensed at its input;
   b. a voltage controlled constant current source having an input terminal and an output terminal, said input terminal in electrical connection with said output terminal of said ramp generator, said voltage controlled constant current source producing a current output decrease in response to a voltage input increase; and c. a width control having a first input and a second input and an output, said first input in electrical connection with said apparatus input channel, said second input in electrical connection with said output terminal of said voltage controlled constant current source so that a pulse train is generated at the output of said width control said pulse train synchronous with said input pulse train and having pulses of varying width, from narrower than to wider than those of the input pulse train, when said ramp generator is enabled.

4. Output combining logic as described in claim 3 which comprises:

a. a first AND logic gate having two input terminals and an output terminal, the first input terminal in electrical connection with said second output terminal of said second flip-flop and the second input terminal in electrical connection with said apparatus input channel;

b. a second AND logic gate having three input terminals and one output terminal, the first input terminal in electrical connection with said apparatus input channel, the second input terminal in electrical connection with said first output of said second flip-flop and the third input in electrical connection with the output of said width control; and c. an OR logic gate having two input terminals and an output terminal the first input terminal in electrical connection with the output terminal of said first AND logic gate and the second input terminal in electrical connection with the output terminal of said second AND logic gate whereby there appears at the output of said OR logic gate a pluse train identical to the input pulse train when the period of said pulses is greater than $t_1$ and, after two pulses, pulses narrowed, then gradually widening to the width of said input pulses when the period of said input pulses is less than or equal to $t_1$ thereby moderating the increase in duty cycle associated with an increase in pulse rate repetition frequency.

5. A voltage controlled constant current source as described in claim 4 wherein the ratio of maximum current output to minimum current output is 10 to 1.

6. A high pulse repetition frequency detector which senses a change in the pulse repetition frequency of an input pulse train from a low frequency state (period of pulses greater than $t_1$) to a high frequency state (period of pulses less than or equal to $t_1$) transmitted through an apparatus input channel which comprises:

a. a one shot logic device having an input terminal and an output terminal said one shot logic device electrically coupled at its input terminal to said apparatus input channel and producing a pulse of width $t_1$ in response to the leading edge of a pulse at its input;

b. a first flip-flop logic device having an output terminal, a clock input in electrical connection with said apparatus input channel, a clock reset input and a clear input said clear input in electrical connection with said one shot device output;

c. a second flip-flop logic device having a first output and a second output of complementary logic, a clock input and a clear input;

d. said clock input of said second flip-flop in electrical connection with the output terminal of said first flip-flop, said clear input of said second flip-flop in electrical connection with the output terminal of said one shot logic device, said second output of said second flip-flop in electrical connection with said clock reset of said first flip-flop so that when the period of said input pulse train is $t_1$ or less said first output of said second flip-flop is maintained, during the duration of the portion of the pulse of such period, in its high logic state and said second output of said second flip-flop is driven to and maintained in its low logic state.

* * * * *